(12) United States Patent
Kobayashi (10) Patent No.: US 8,486,831 B2
(45) Date of Patent: Jul. 16, 2013

(54) SEMICONDUCTOR DEVICE MANUFACTURING METHOD

(75) Inventor: Hirotaka Kobayashi, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 0 days.

(21) Appl. No.: 13/303,610

(22) Filed: Nov. 23, 2011

(65) Prior Publication Data

US 2012/0070978 A1    Mar. 22, 2012

Related U.S. Application Data (62) Division of application No. 12/420,307, filed on Apr. 8, 2009, now abandoned.

(30) Foreign Application Priority Data

Apr. 11, 2008   (JP) .................................. 2008-103284

(51) Int. Cl.
*H01L 21/473*    (2006.01)

(52) U.S. Cl.
USPC ........... 438/672; 438/666; 438/669; 438/671; 438/700; 257/306; 257/774; 257/E21.24; 257/E21.266; 257/E21.243

(58) Field of Classification Search
USPC ................. 438/666, 667, 669, 671, 672, 673, 438/374, 375, 700, 735, 736, 738, 742, 743; 257/306, 307, 308, 309, 311, 773, 774, E21.24, 257/E21.266, E21.243
See application file for complete search history.

(56) References Cited

U.S. PATENT DOCUMENTS

| | | | |
|---|---|---|---|
| 5,918,122 A | 6/1999 | Parekh et al. | |
| 6,239,022 B1 | 5/2001 | Seo et al. | |
| 6,492,223 B2 | 12/2002 | Kanamori et al. | |
| 6,759,720 B2 | 7/2004 | Shinkawata | |
| 7,151,291 B2 | 12/2006 | Parekh et al. | |
| 7,521,746 B2* | 4/2009 | Lee .............................. | 257/298 |
| 2001/0046737 A1 | 11/2001 | Ahn et al. | |
| 2004/0031980 A1 | 2/2004 | Narui et al. | |
| 2004/0061162 A1 | 4/2004 | Jin et al. | |
| 2006/0186479 A1 | 8/2006 | Seo et al. | |
| 2006/0231392 A1* | 10/2006 | Mullapudi et al. ........ | 204/298.11 |
| 2006/0255384 A1 | 11/2006 | Baars et al. | |
| 2006/0261392 A1 | 11/2006 | Lee et al. | |
| 2009/0068809 A1 | 3/2009 | Seo et al. | |

FOREIGN PATENT DOCUMENTS

JP    2001-298082    10/2001

* cited by examiner

*Primary Examiner* — Eduardo A Rodela
(74) *Attorney, Agent, or Firm* — Young & Thompson (57) ABSTRACT

A miniaturized semiconductor device is provided by reducing the design thickness of a wiring line protecting film covering the surface of a wiring layer, and reducing the distance between the wiring layer and via plugs formed by a self-aligning process. Dummy mask layers extending in the same layout pattern as the wiring layer is formed above the wiring layer covered with a protecting film composed of a cap layer and side wall layers. In the self-aligning process for forming via plugs in a self-aligned manner with the wiring layer and its protecting film, the thickness of the cap layer is reduced and the design interval between the via plugs is reduced, whereby the miniaturization of the semiconductor device is achieved.

20 Claims, 9 Drawing Sheets

SEMICONDUCTOR DEVICE MANUFACTURING METHOD

CROSS REFERENCE TO RELATED APPLICATIONS

This application is a division of co-pending application Ser. No. 12/420,307 filed on Apr. 8, 2009, which claims foreign priority to Japanese patent application No. 2008-103284 filed on Apr. 11, 2008. The entire content of each of these applications is hereby expressly incorporated by reference.

BACKGROUND OF THE INVENTION

1. Field of the Invention

This invention relates to a semiconductor device, a manufacturing method thereof, and a data processing system. More particularly, this invention relates to a semiconductor device having wiring lines the surfaces of which are covered with a protecting insulation film, a manufacturing method thereof, and a data processing system including such a semiconductor device.

2. Description of the Related Art

Recent progress in miniaturization of semiconductor devices has made it difficult to form hole patterns solely with photolithography. In cell arrays of a memory product such as a DRAM, in particular, a hole pattern having holes arranged with minimum pitches must be formed in spaces of wiring lines which are arranged also with minimum pitches in a wiring layer, without causing short circuit with the wiring layer. Therefore, the hole size is reduced significantly, which makes it difficult to form the hole pattern only with photolithography.

Conventionally, this problem has been solved by employing a fine hole pattern formation method in which a silicon nitride (SiN) protecting film formed to cover the surface of a wiring layer is used as a mask, and a hole pattern is formed by a selective etching using a slit pattern formed orthogonally to the protecting film. Using the selective etching process, an interlayer insulation film is etched with a high selection ratio to SiN to form slit grooves corresponding to the slit pattern, and the slit grooves are filled with a conductive material. Subsequently, excessive conductive material is removed by CMP (Chemical-Mechanical Polishing) while using, as a stopper, the SiN film covering the surface of the wiring layer, whereby the conductive material is divided into separate via plugs.

According to this method, however, the SiN film functioning as a mask is thinned several times, specifically by the etching for processing the wiring layer, the etching for forming slit grooves, and the polishing by CMP. This makes it difficult to leave the SiN film with a sufficient thickness so as not to expose the wiring layer ultimately. If the initial thickness of the SiN film is increased to ensure the SiN film is left with a sufficient thickness, it becomes difficult to fill the narrow spaces between the wiring layers arranged with a minimum pitch, with the insulation film. This poses a problem that the increased thickness of the SiN film for protecting the wiring lines hampers the miniaturization of the semiconductor device.

Japanese Laid-Open Patent Publication No. 2001-298082 (Patent Document 1) describes a technique for solving the problem above. According to Patent Document 1, a SiN protecting film covering the surface of a wiring layer forming each bit line of a DRAM device is covered with an interlayer insulation film, and an etching stopper film made of NSG (non-silicon glass) is formed all over the surface of the interlayer insulation film. A thick interlayer insulation film for accommodating storage nodes is formed on the etching stopper film. When etching the interlayer insulation film, the etching stopper film prevents the SiN protecting film from being etched away, and hence the reduction of the thickness of the SiN protecting film can be prevented. When the etching of the interlayer insulation film is completed, the etching stopper film is then etched. Further, a self-aligning etching is performed on the bit lines, whereby contact holes are formed to reach a diffusion layer in the silicon substrate. A $Si_3N_4$ film for example is used as the etching stopper film.

SUMMARY

According to the method disclosed in Patent Document 1 described above, the amount of etching of the SiN protecting film covering the surface of the wiring layer is decreased during the etching for the formation of contacts for connecting between capacitors and underlying nodes. However, as the miniaturization progresses, the diameter of the storage nodes is reduced and the depth thereof is increased further. Thus, according to this method in which the etching for the formation of capacitors and the etching for the formation of contacts for connecting the capacitors to underlying nodes are performed simultaneously, the aspect ratio during the etching is increased significantly, which makes the etching itself difficult. Moreover, it also becomes difficult to achieve alignment and dimensional control for avoiding short circuit with other nodes or misalignment relative to the underlying connection nodes, causing hampering on miniaturization of memory cells.

This invention to provide therefore provides a semiconductor device suitable for miniaturization, and a manufacturing method of such a semiconductor device.

This invention provides a semiconductor device having: a wiring layer including a plurality of wiring lines, the surface of each of which is covered with an insulation protecting film, the entire of the wiring layer being covered with a first interlayer insulation film; a plurality of dummy insulation films made of a different material from that of the first interlayer insulation film, and extending, above the first interlayer insulation film, in the same layout as that of the plurality of wiring lines; and a conductive plug passing through the first interlayer insulation film between two adjacent wiring lines of the plurality of wiring lines, the conductive plug being formed in self-aligned manner with the two adjacent wiring lines and the insulation protecting film corresponding thereto.

Another aspect of this invention provides a data processing system having a data processor and a memory connected to the data processor. In this data processing system, the memory includes: a wiring layer including a plurality of wiring lines, the surface of each of which is covered with an insulation protecting film, the entire of the first wiring layer being covered with a first interlayer insulation film; a plurality of dummy insulation films made of a different material from that of the first interlayer insulation film, and extending, above the first interlayer insulation film, in the same layout as that of the plurality of wiring lines; and a conductive plug passing through the first interlayer insulation film between two adjacent wiring lines of the plurality of wiring lines, the conductive plug being formed in self-aligned manner with the two adjacent wiring lines and the insulation protecting film corresponding thereto.

Still another aspect of this invention provides a manufacturing method of a semiconductor device including the steps of: forming a wiring layer including a plurality of wiring lines, the surface of each of which is covered with an insulation protecting film; forming a first interlayer insulation film to cover the wiring layer; forming a dummy insulation films extending above the first interlayer insulation film, in the same layout as that of the plurality of wiring lines; forming a via hole passing through the first interlayer insulation film, in a self-aligned manner with the plurality of wiring lines and the insulation protecting film covering the plurality of wiring lines; and forming a via plug within the via hole.

In exemplary embodiments, a pattern used to etch the first interlayer insulation film for formation of contact holes and via holes for accommodating conductive plugs is a slit pattern extending in an orthogonal direction to the wiring layer. Therefore, the misalignment in this direction is prevented. Further, since the pattern is a line pattern, a sufficient photolithographic resolution margin can be ensured easily for miniaturization of the semiconductor device, and the opening ability for the etching process also can be ensured easily. Further, during the slit etching and the CMP for isolation of contacts, the insulation protecting films of the wiring lines are protected by the dummy insulation films formed above the wiring lines in the same layout as the wiring layer. Therefore, the reduction of thickness of the insulation protecting films can be prevented during these processes. This makes it possible to ensure a sufficient processing margin when the dimensions of and intervals between the wiring lines and the conductive plugs are reduced, and makes it easy to miniaturize the internal structure of the semiconductor device.

DETAILED DESCRIPTION OF EXEMPLARY EMBODIMENTS

Exemplary embodiments of this invention will be described in detail with reference to the accompanying drawings. In all the drawings, like elements are assigned with like reference numerals.

Figure 1:
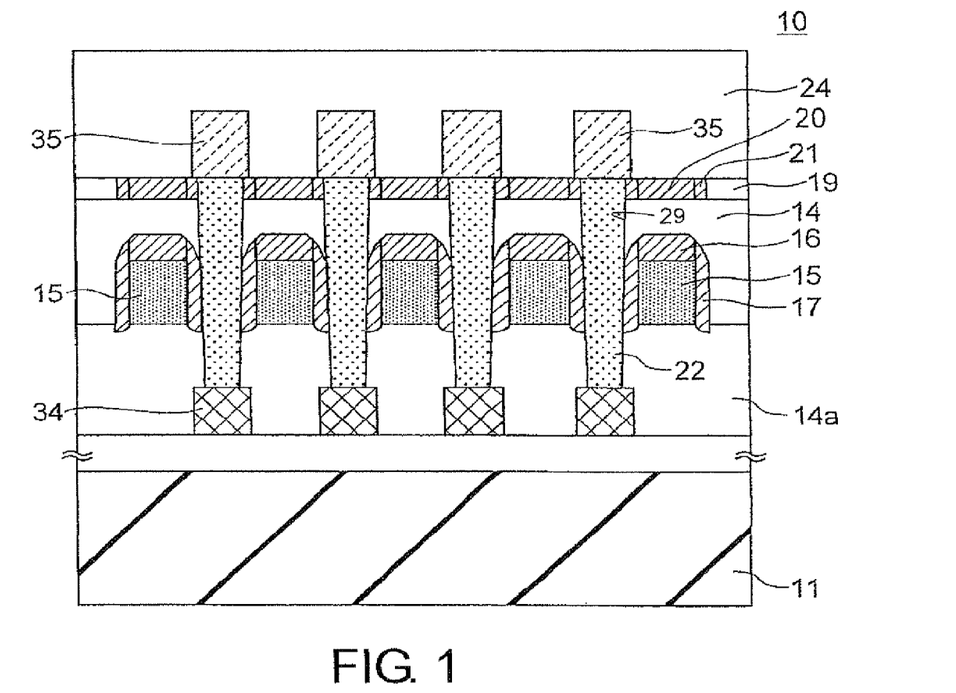
FIG. 1 is a cross-sectional view showing a semiconductor device according to a first exemplary embodiment of this invention.
Figure 2:
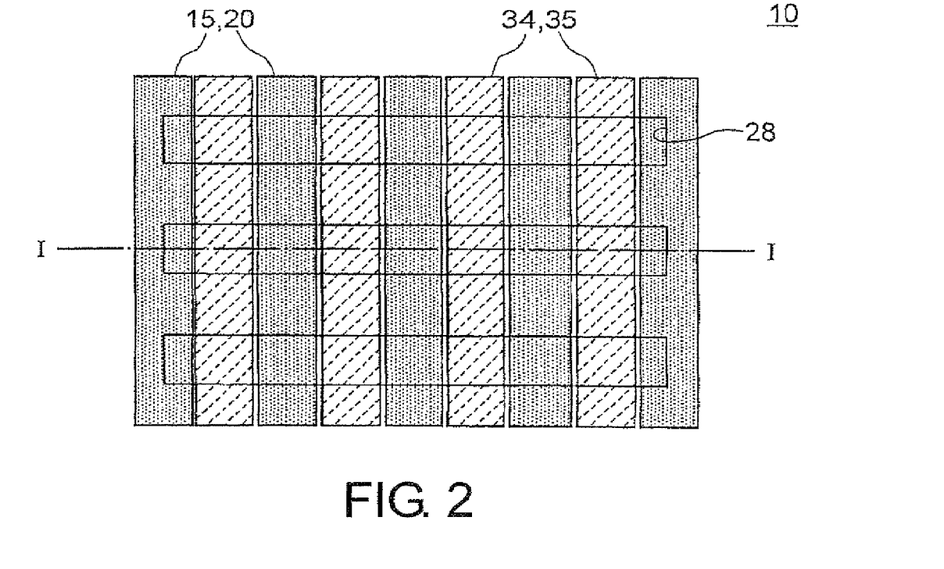
FIG. 2 is a plan view showing a pattern layout of the semiconductor device of FIG. 1.

FIG. 1 is a cross-sectional view showing a semiconductor device according to a first embodiment of this invention. FIG. 2 shows a pattern layout of this semiconductor device. FIG. 1 is a cross-sectional view taken along the line I-I of FIG. 2.

As shown in FIGS. 1 and 2, a semiconductor device 10 has a semiconductor substrate 11, first to third wiring layers 34, 15 and 35 formed on top of the semiconductor substrate 11, first to fourth interlayer insulation films 14a, 14, 19, and 24 for insulating between these wiring layers, dummy mask layers 20 and 21 interposed between the second interlayer insulation film 14 and the fourth interlayer insulation film 24 and formed above wiring lines of the second wiring layer 15, and via plugs 22 for connecting the first wiring layer 34 and the third wiring layer 35. Each of the via plugs 22 passes through between two adjacent wiring lines of the second wiring layer 15.

Each of the wiring lines of the second wiring layer 15 is provided with a silicon nitride (SiN) protecting film including a cap layer 16 and side-wall layers 17 both made of SiN films. The surfaces of the wiring lines of the second wiring layer 15 are covered with these SiN protecting films. The dummy mask layers, formed of a SiN film, cover the wiring lines of the second wiring layer 15 from above, and have the same pattern layout as the wiring lines, extending along the same direction as the wiring lines. Each of the dummy mask layers 20, 21 is composed of a central portion 20 formed at a position where the central portion 20 overlaps with the cap layer 16 of the SiN protecting film in plan view, and side portions 21 formed at positions where the side portions 21 overlap with the side-wall layers 17 in plan view.

As shown in FIG. 2, the wiring lines of the second wiring layer 15 and the central portions 20 of the dummy mask layers are located on the same layout, while the first wiring layer 34 and the third wiring layer 35 are located on the same layout. The first wiring layer is connected to the third wiring layer by the via plugs 22 not shown in FIG. 2. The reference numeral 28 in FIG. 2 indicates a slit pattern used for forming a hole pattern for accommodating the via plugs 22, and also indicates a slit groove formed in the third insulation film 19 by using the slit pattern.

In the fabrication of the structure described above, according to this embodiment, via holes for accommodating the via plugs 22 are formed by etching such that the slit grooves 28 are formed in a direction orthogonal to the direction of the wiring lines of the second wiring layer 15 in a part corresponding to the third interlayer insulation film 19 (see FIG. 2), while in a part corresponding to the first and second interlayer insulation film 14a and 14, the via holes are formed as through holes 29 passing through the insulation films. Hereinbelow, a pattern including the slit grooves 28 and the through holes 29 is referred to as a hole pattern. After formation of this hole pattern, a conductive material is deposited on the entire surface so as to fill the through holes 29 and the slit grooves 28 with the conductive material. Subsequently, the deposited conductive material is polished by using a CMP process, while using the dummy mask layers 20, 21 formed of SiN films as the etching stop layers. The conductive material in the slit grooves 28 is removed by the CMP polishing and the via plugs are isolated from each other. By this process, the via plugs 22 are obtained to connect the wiring lines of the first wiring layer 34 to the corresponding wiring lines of the third wiring layer 35.

In the fabrication of the semiconductor device 10 according to this embodiment, the slit pattern 28 is employed in place of the hole pattern when forming the via holes. This makes it possible to improve the photolithography resolution in further miniaturized configuration, and to avoid problems related to dimensional accuracy or misalignment of the slits in their extension direction. Further, the dummy mask layers 20 and 21 having the same layout as that of the second wiring layer 15 are formed above the second wiring layer 15 in which the wiring lines are arranged at narrow pitch. According to this configuration, the dummy mask layers 20 and 21 function not only as an etching stopper layer when etching the slit pattern 28 for forming the via holes in self-alignment with the wiring structure including the second wiring layer 15 and the SiN protecting films 16 and 17, but also as a CMP stopper layer during the CMP later performed for isolation of the via holes. This makes it possible to minimize the reduction of thickness of the SiN protecting films 16 and 17 which protect the second wiring layer 15 below the dummy mask layers 20 and 21. In this manner, it is made possible to minimize the reduction of the thickness of the SiN protecting film that poses the most significant problem in the via opening process, in which the opening of the slit and the leveling by the CMP are combined, and hence the miniaturization of the semiconductor device is made easier.

Figure 3A:
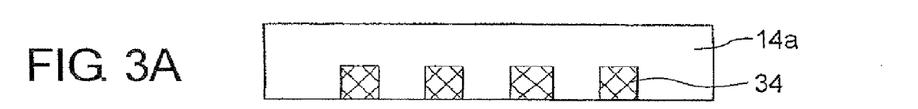
FIGS. 3A, 3B, 3C, and 3D are cross-sectional views sequentially showing manufacturing steps of the semiconductor device of the first embodiment.
Figure 3B:
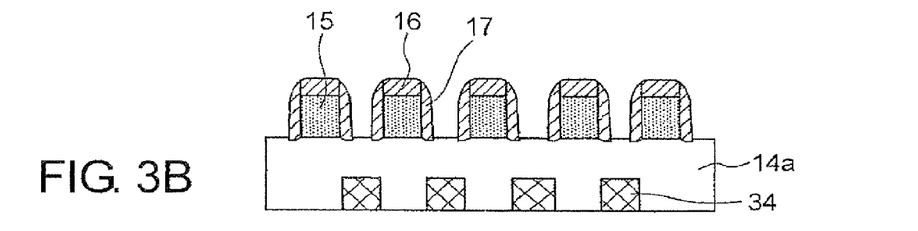

Referring to FIGS. 3A-3D and FIGS. 4A-4C, a process for manufacturing the semiconductor device according to the first exemplary embodiment will be described in further detail. In these figures, illustration of the structure below the first wiring layer, including the semiconductor substrate, is omitted. Firstly, a patterned first wiring layer 34 and a first interlayer insulation film 14a covering the first wiring layer 34 are formed above the semiconductor substrate (FIG. 3A). Subsequently, a patterned cap layer 16 and a second wiring layer 15 are formed thereon. Further, a side wall layer 17 is formed on the side walls of the cap layer 16 and second wiring layer 15 by means of CVD and an etch-back method to provide, together with the cap layer 16, a SiN protecting film for protecting the wiring layer 15 (FIG. 3B).

Figure 3C:
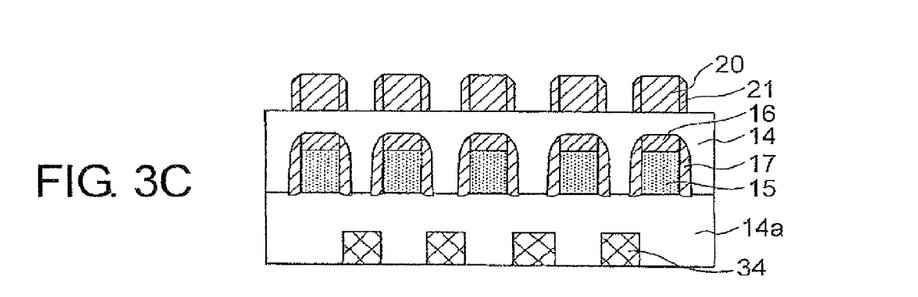
Figure 3D:
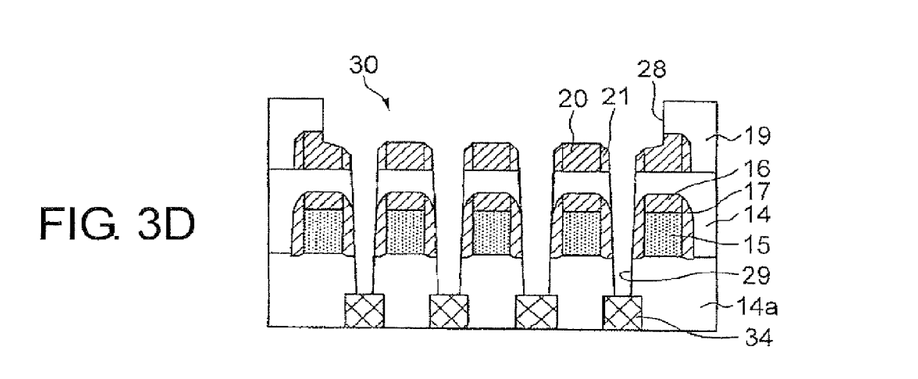

After that, a second interlayer insulation film 14 is deposited, and dummy mask layers 20, 21 having the same layout pattern as the pattern of the wiring lines of the second wiring layer 15 are deposited (FIG. 3C). In the formation of the dummy mask layers 20, 21, the central portions 20 are first formed by depositing and patterning a SiN film, and then the side portions 21 are formed by depositing and etching back a SiN film. Subsequently, after a third interlayer insulation film 19 is deposited, an amorphous carbon and a plasma SiON film are deposited as an etching hard mask layer to be used later (not shown) and a photoresist pattern (not shown) having the pattern of the slit grooves 28 shown in FIG. 2 is formed on the hard mask layer. Via holes passing through the third to first interlayer insulation films 19, 14, and 14a are formed by using this photoresist pattern and the hard mask as patterned, and performing etching in self-aligned manner with the dummy mask layers 20, 21 and the second wiring layer 15 including the SiN protecting films 16 and 17. An etching process having high selectivity to the SiN film is applied to this etching process. Via holes passing through the third to first interlayer insulation films 19, 14, and 14a are formed by using this photoresist pattern and the hard mask layer as a mask, and performing etching in self-aligned manner with the dummy mask layers 20, 21 and the second wiring layer 15 including the SiN protecting films 16 and 17. An etching process having high selectivity to the SiN film is applied to this etching process. As a result of this etching, a hole pattern 30 is formed, consisting of the slit grooves 28 extending orthogonally to the wiring lines of the second wiring layer 15 in the third interlayer insulation film 19, and through holes 29 passing through the second and first interlayer insulation films 14 and 14a between two adjacent wiring lines of the second wiring layer 15 (FIG. 3D).

Figure 4A:
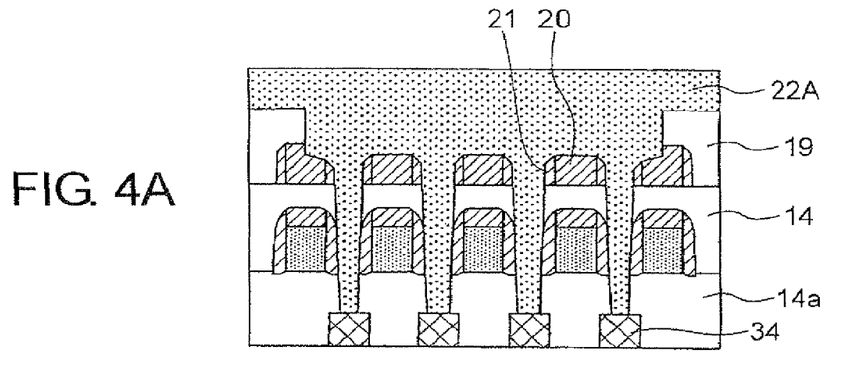
FIGS. 4A, 4B, and 4C are cross-sectional views sequentially showing manufacturing steps following those shown in FIG. 3D.
Figure 4B:
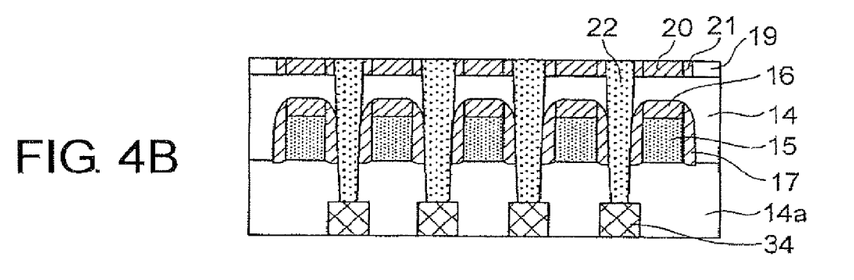
Figure 4C:
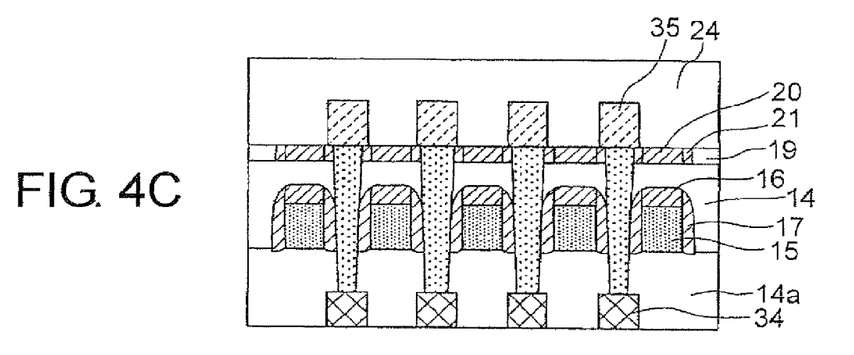

After that, a tungsten (W) layer 22A is deposited on the entire surface (FIG. 4A). Subsequently, the W layer 22A is polished by CMP with the dummy mask layers 20 and 21 used as a stopper, whereby via plugs 22 isolated from each other are obtained (FIG. 4B). Then, a third wiring layer 35 is formed on the polished dummy mask layers 20 and 21 and the third interlayer insulation film 19 so that the third wiring layer 35 is in contact with the top of each of the via plugs 22. Subsequently, a fourth interlayer insulation film 24 is deposited on the entire surface (FIG. 4C).

In the embodiment described above, any desired structure can be employed as the structure below the second wiring layer 15. The second wiring layer may be formed as gate electrodes, and the first wiring layer may be formed as a diffusion layer formed within the semiconductor substrate.

Figure 5A:
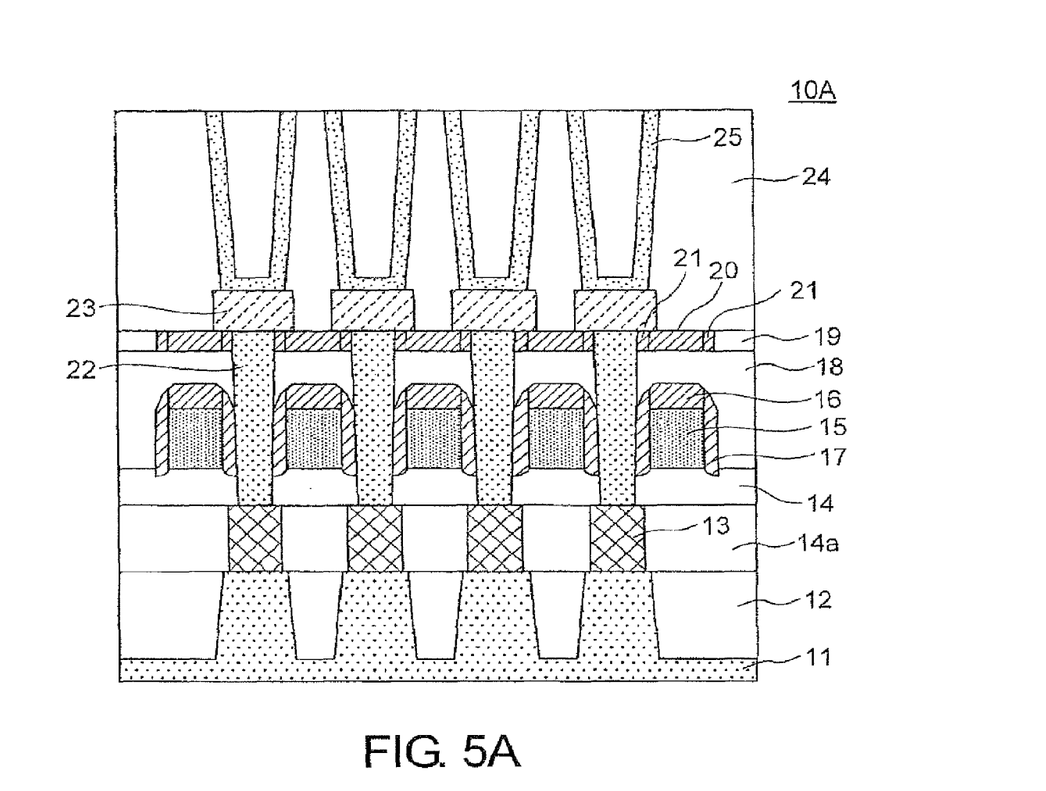
FIG. 5A is a cross-sectional view showing a semiconductor device according to a second exemplary embodiment of this invention.
Figure 5B:
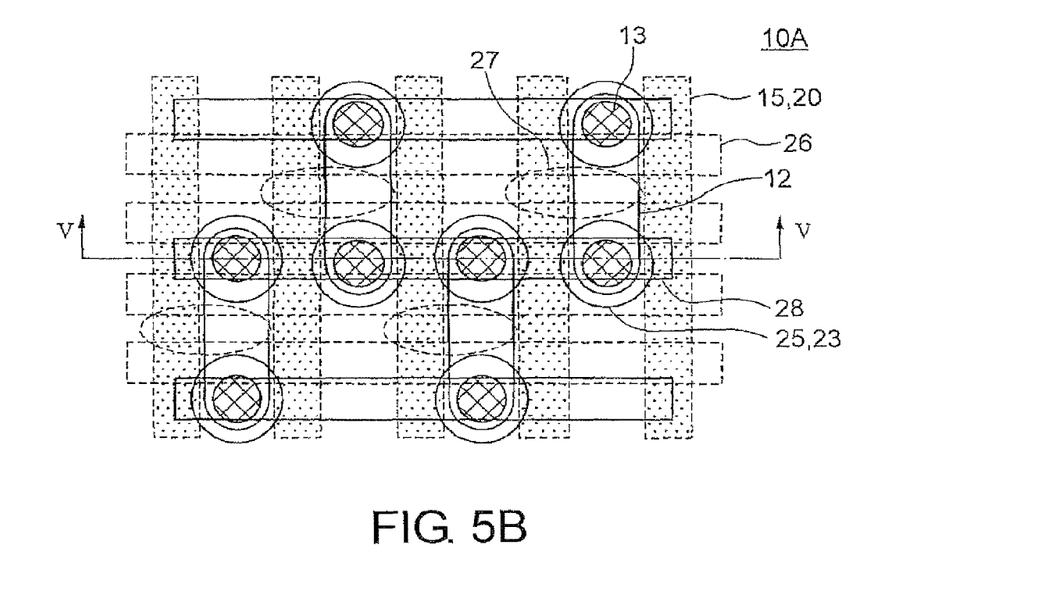
FIG. 5B is a plan view showing a pattern layout of the semiconductor device of FIG. 5A.

FIG. 5A is a cross-sectional view of a semiconductor device according to a second exemplary embodiment of this invention, and FIG. 5B is a plan view of a layout pattern of the semiconductor device shown in FIG. 5A. FIG. 5A is a cross-sectional view taken along the line V-V of FIG. 5B. FIG. 5B shows slit grooves 28 formed during etching. The semiconductor device of this embodiment is configured as a DRAM device. The DRAM device 10A is formed on a semiconductor substrate 11, and the semiconductor substrate 11 has an active region defined by an insulation film forming an element isolation region 12. The DRAM device 10A includes first to fifth interlayer insulation films 14a, 14, 18, 19, and 24, a first wiring layer forming gate electrodes 26, a second wiring layer 15 formed on a second interlayer insulation film 14 to form bit lines, dummy mask layers 20 and 21 arranged on a third interlayer insulation film 18 in correspondence with the wiring lines of the second wiring layer 15, landing pads 23 formed on the dummy mask layers 20 and 21, and capacitors having capacitor nodes 25 formed on the landing pads 23.

Lower electrodes (contact plugs) 13 are formed on the diffusion layer in the active region defined by the element isolation regions 12. The lower electrodes 13 and the landing pads 23 are connected to each other through the via plugs 22. Each of the second wiring layer 15 is formed in a region sandwiched between the lower electrode 13 and the landing pad 23 in a vertical direction. The via plugs 22 are each formed between two adjacent bit lines formed by the second wiring layer 15 by means of a self-aligning process.

Each of the bit lines formed by the second wiring layer 15 is covered with and protected by a cap layer 16 functioning as a mask during patterning of the wiring lines and a side-wall layer 17. The cap layer 16 and the side wall layer 17 together form a SiN protecting film for protecting the second wiring layer 15. The dummy mask layers are each composed of a central portion 20 corresponding to the cap layer 16 of the second wiring layer 15, and a side portion 21 corresponding to the side wall layer 17, and are arranged in the same layout pattern as the bit lines. The cap layer 16 and the side wall layer 17 function as a wiring line protecting layer for preventing short circuit between the bit line 15 and the via plug 22 when misalignment occurs between the bit line 15 and the central portion 20 of the dummy mask layer. In FIG. 5B showing the overall layout of the semiconductor device, there are shown gate electrodes 26 extending orthogonally to the second wiring layer and source contacts 27 formed between the gate electrodes in a self-aligned manner.

In the DRAM device 10A of this embodiment, the dummy mask layers 20 and 21 having the same layout as the layout of the bit lines are formed above the second wiring layer 15 forming the bit lines arranged at narrow pitch. This configuration makes it possible to prevent the reduction of the thickness of the SiN protecting films 16 and 17 protecting the bit lines 15 during formation of via holes, which reduction poses the most significant problem in the via-opening process combining opening of slits and leveling by CMP where the via holes are formed in a self-aligned manner with respect to the wiring structure including the bit lines 15 and the SiN protecting films 16 and 17. Therefore, the design thickness of the SiN protecting films 16 and 17 covering the bit lines 15 can be set to a small value, and hence the design interval between the via plugs 22 can also be set to a small value. As a result, the miniaturization of the semiconductor device is made easier.

Figure 7A:
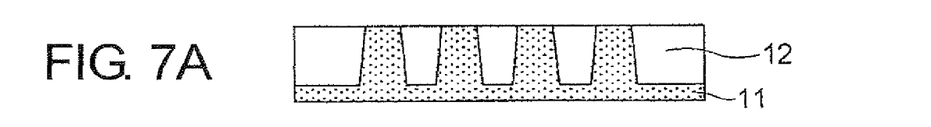
FIGS. 7A, 7B, 7C, 7D, and 7E are cross-sectional views sequentially showing manufacturing steps of the semiconductor device of the second embodiment.
Figure 7B:
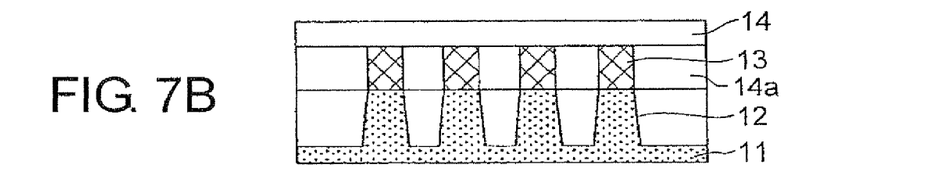

Referring to FIGS. 7A-7E and FIGS. 8A-8C, a manufacturing process of a DRAM device as a semiconductor device according to a second exemplary embodiment of the invention will be described. First, element isolation (STI) regions 12 are formed in a surface part of a semiconductor substrate 11 are formed by a conventional technique to divide the semiconductor substrate 11 into a plurality of active regions (FIG. 7a). Subsequently, a MISFET (not shown) including a source/drain diffusion layer and a gate electrode is formed in each of the active regions. Subsequently, a silicon oxide film is formed by CVD and planarized by CMP to form a first interlayer insulation film 14a. The first interlayer insulation film 14a is then patterned by photolithography and dry etching so that a contact hole is formed on the diffusion layer in each active region. Polysilicon is deposited on the first interlayer insulation film 14a, as well as in the inside of the contact holes, and the deposited polysilicon layer is divided by CMP to form lower electrodes 13. A further silicon oxide film is formed by CVD and planarized by CMP to form a second interlayer insulation film 14 (FIG. 7B).

Figure 7C:
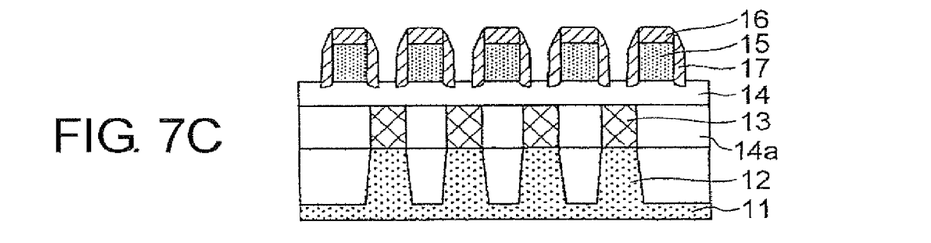

After that, a tungsten (W) film and a SiN film are deposited by CVD or the like, and then bit lines 15 and a cap layer 16 are formed by photolithography and dry etching. Further, a SiN film is deposited by CVD and side wall layers 17 are formed by etching back the SiN film. As a result, a second wiring layer 15 formed of bit lines, the surfaces of which are protected by the SiN protecting film, is obtained (FIG. 7C). Subsequently, a silicon oxide film is formed on the second wiring layer 15 by CVD or the like and planarized by CMP, whereby a third interlayer insulation film 18 is formed.

Figure 7D:
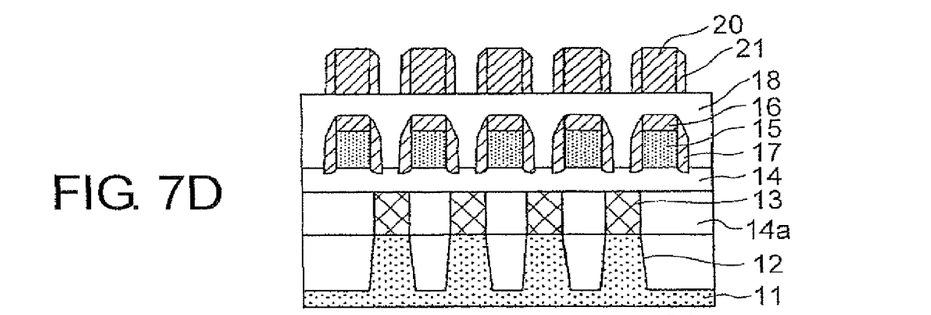
Figure 7E:
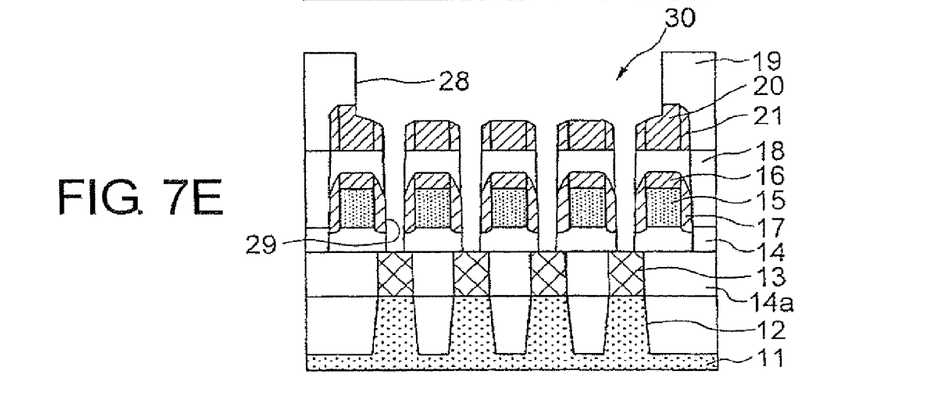

A SiN film is then deposited by CVD or the like, and subjected to photolithography and dry etching to form central portions 20 of dummy mask layers. The central portions 20 are patterned in the same layout pattern as that of the bit lines 15. Subsequently, a SiN film is deposited by CVD or the like, and etched back to form side portions 21 of the dummy mask layers (FIG. 7D). A silicon oxide film is then formed by CVD or the like and planarized by CMP, whereby a fourth interlayer insulation film 19 is formed. Amorphous carbon and a plasma SiON film are deposited thereon as a hard mask layer to be used later for dry etching (not shown), and then the fourth to second interlayer insulation films 19, 18, and 14 are etched by photolithography and dry etching. During this etching process, the photoresist mask having the pattern of the slit grooves 28 as shown in FIG. 5B and the hard mask so patterned as to have the same pattern of the photoresist are used as the etching mask, and the fourth to second interlayer insulation films 19, 18, and 14 are patterned with a high selection ratio for the SiN. This process provides a hole pattern 30 composed of the slit grooves 28 formed in the fourth interlayer insulation film 19 and the through holes 29 formed in the second and third interlayer insulation films (FIG. 7E). As a result, the top of each of the lower electrodes 13 is opened.

Figure 6:
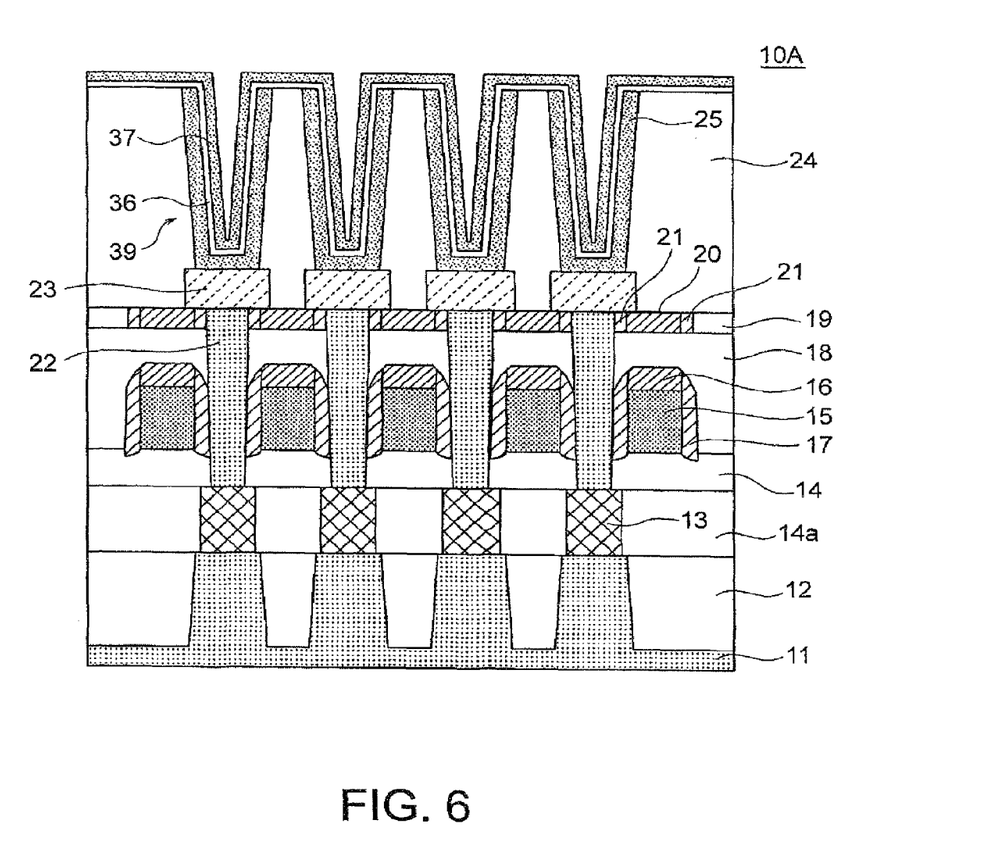
FIG. 6 is a cross-sectional view of a semiconductor device where a capacitor is completed according to the second exemplary embodiment.
Figure 8A:
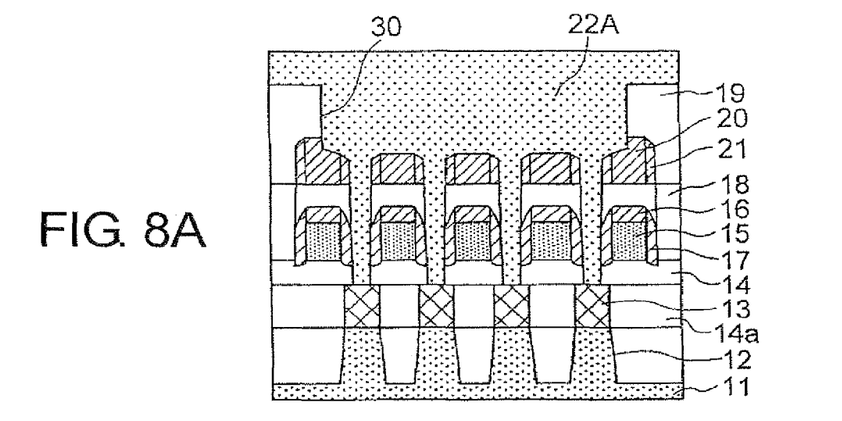
FIGS. 8A, 8B, and 8C are cross-sectional views sequentially showing manufacturing steps following those shown in FIG. 7E.
Figure 8B:
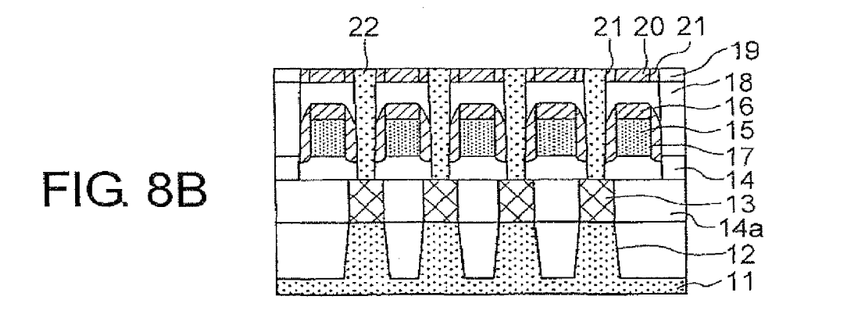
Figure 8C:
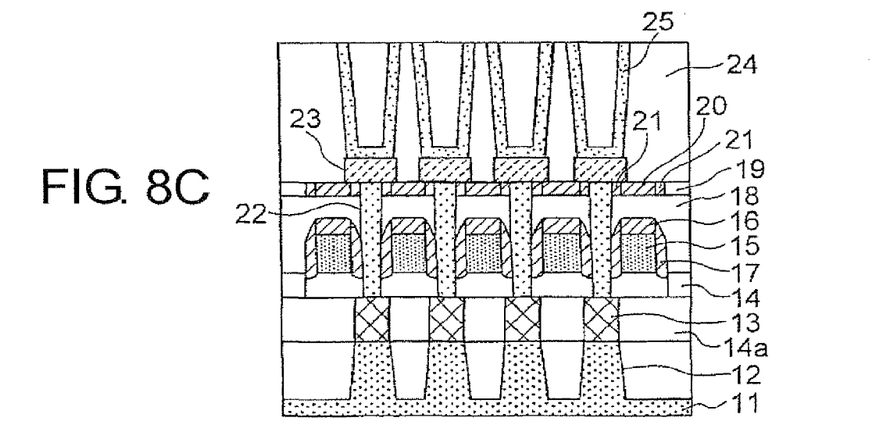

Subsequently, a tungsten layer 22A is deposited on the entire surface as well as within the hole pattern 30 including the slit grooves 28 and the through holes 29 (FIG. 8A). Further, the tungsten layer 22A is polished by CMP with the dummy mask layers 20 and 21 used as a stopper, so that the tungsten layer is removed from the inside of the slit grooves 28 to thereby form via plugs 22 isolated from each other (FIG. 8B). A tungsten film is then formed by CVD and subjected to photolithography and dry etching to form landing pads 23. After that, a conventional DRAM capacitor formation process is performed to form a fifth interlayer insulation film 24 for accommodating capacitors, and capacitor nodes 25 (FIG. 8C). After that, a dielectric film 37 of tantalum oxide or the like and upper electrode, or cell plate, 37 are formed by employing a well-known process to fabricate capacitors 39, and to complete a DRAM device as shown in FIG. 6.

Figure 9:
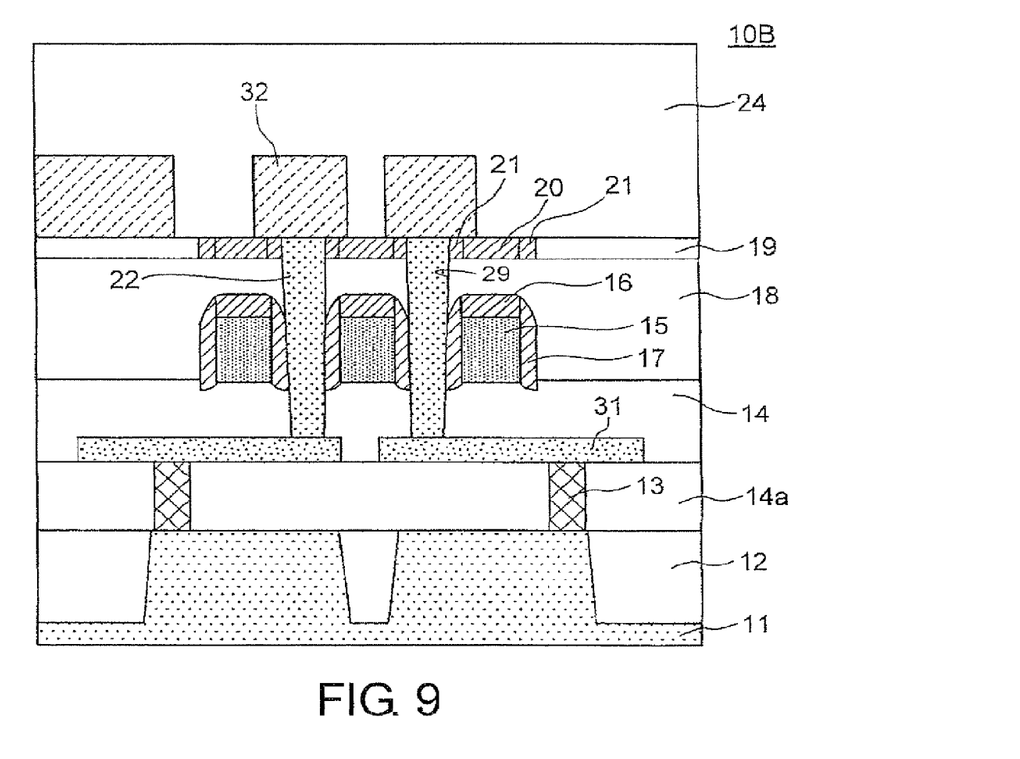
FIG. 9 is a cross-sectional view showing a semiconductor device according to a third exemplary embodiment of this invention.
Figure 10:
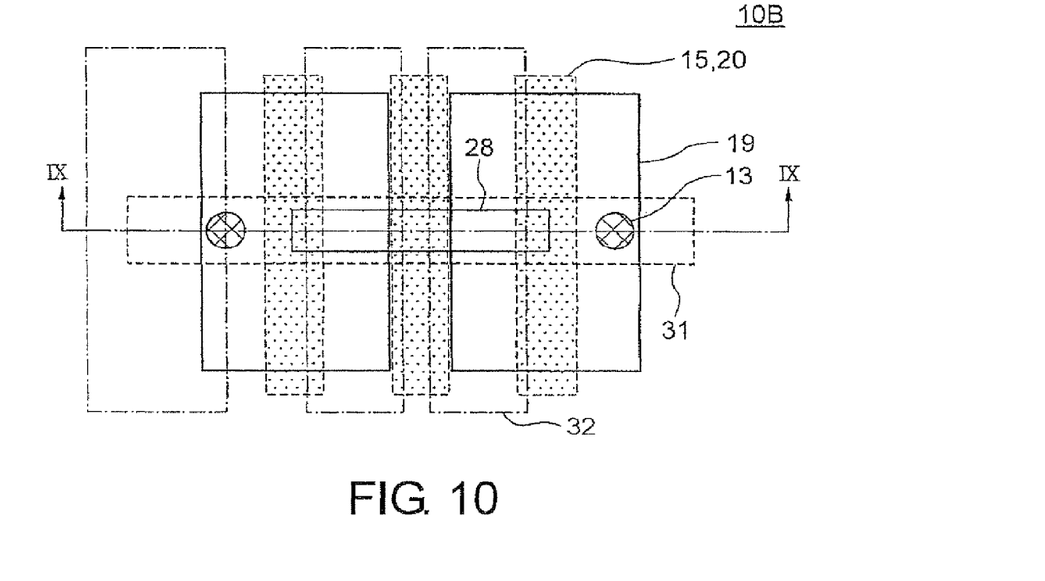
FIG. 10 is a plan view showing a pattern layout of the semiconductor device of FIG. 9.

FIG. 9 is a cross-sectional view showing a semiconductor device according to a third exemplary embodiment of this invention. Like FIG. 2 and so on, FIG. 10 shows a layout pattern of the semiconductor device of this third embodiment. FIG. 9 is a cross-sectional view taken along the line IX-IX of FIG. 10.

The semiconductor device according to the third embodiment relates to a case in which the configuration of this invention is applied to a logic circuit. In the logic circuit, a first wiring layers 31, a second wiring layer 15 and a third wiring layer 32 are illustrated. These wiring layers may be formed of a material such as tungsten, aluminum, or copper. The semiconductor device 10B is manufactured by a process as described below. Firstly, element isolation regions 12 are formed to define active regions on a semiconductor substrate 11 by a STI process used in a conventional manufacturing process of semiconductor devices. Then, a MISFET (not shown) having a source/drain diffusion layer and a gate electrode is formed in each of the active regions. Subsequently, a silicon oxide film is formed by CVD or the like and planarized by CMP to thereby form a first interlayer insulation film 14a.

In the next step, photolithography and dry etching are performed to form contact holes on the diffusion layer in the active regions. Subsequently, these contact holes are filled with tungsten by CVD or the like, and the tungsten on the first interlayer insulation film 14a is removed by using CMP or the like, whereby contact plugs 13 are formed. Then, a tungsten film is formed by CVD or the like, and subjected to photolithography and dry etching so that a first wiring layer 31 is formed. A silicon oxide film is then formed by CVD or the like and planarized by CMP to form a second interlayer insulation film 14.

In the next step, tungsten and SiN films are deposited by CVD or the like, and subjected to photolithography and dry etching to form a second wiring layer 15 and a cap layer 16 formed of the SiN film. Subsequently, a SiN film is deposited by CVD or the like, and etched back to form side wall layers 17. A silicon oxide film is then formed by CVD or the like and planarized by CMP to thereby form a third interlayer insulation film 18. A SiN film is then deposited by CVD or the like and subjected to photolithography and dry etching to thereby form central portions 20 of dummy mask layers. The central portions 20 of the dummy mask layers are formed in exactly the same layout pattern as that of the second wiring layer 15. Subsequently, a SiN film is deposited by CVD or the like, and etched back to form side portions 21 of the dummy mask layers.

In the next step, a silicon oxide film is formed by CVD or the like and planarized by CMP to thereby form a fourth interlayer insulation film 19. Amorphous carbon and a plasma SiON film are deposited on the fourth interlayer insulation film 19 as a hard mask layer to be used later for dry etching (not shown). Photolithography and dry etching are then performed so that a hole pattern including through holes 29 and a slit pattern 28 arranged orthogonally to the second wiring layer 15 and the dummy mask layers 20 and 21 is formed in the fourth to second insulation films 19, 18, and 14. An etching process having a high selectivity to SiN is employed for this dry etching. The dummy mask layers 20 and 21, the cap layer 16, and the side-wall layers 17 serve as a mask during the dry etching, and the hole pattern including the slit pattern 28 is formed by a self-aligning process.

Subsequently, the cavities of the hole pattern including those of the slit pattern are filled with tungsten by CVD or the like. A CMP process is then performed with the use of the dummy mask layers 20 and 21 as a stopper, so that the tungsten in the through holes 29 is isolated from each other to form via plugs 22.

Next, an aluminum film is formed and subjected to photolithography and dry etching to thereby form a third wiring layer 32. A silicon oxide film is then formed by CVD or the like and planarized by CMP to thereby form a fifth interlayer insulation film 24. As a result, a semiconductor device 10B forming a logic circuit as shown in FIG. 9 is obtained.

According to this third exemplary embodiment relating to a logic circuit for use in a semiconductor product, via plugs can be formed in a self-aligned manner in narrow spaces between signal wiring lines formed in a wiring layer and arranged at a narrow interval without causing short circuit with the wiring lines. This makes it possible to connect between signal wiring lines in upper and lower layers formed to sandwich the wiring layer with a narrow space. This configuration enables the signal lines to be connected in a variety of ways, and thus makes it possible to reduce the layout area.

In the embodiment described above, the wiring layers and the via plugs may be formed of any other conductive material such as copper. Further, when forming the hole pattern including the slit pattern by the self-aligning process, the material to be used is not limited to the SiN used in the embodiment above. During the dry etching and the CMP process, any insulation film may be employed as the stopper film, as long as it has a lower etching rate and a lower polishing rate than an oxide film.

In a conventional method, the thickness of a protecting film for protecting wiring layers has to be determined in view of possible reduction of the thickness in all the processes, including processing of wiring layers, opening of via holes, and CMP. According to the third exemplary embodiment of the invention, in contrast, the thickness can substantially be determined by only taking into consideration the reduction of film thickness during the patterning of the wiring layers. This makes it possible to set the design pitch for arranging the via plugs formed in the via holes to a smaller value, and hence to further increase the integration density of the semiconductor device. Further, the configuration of this invention can be applied to a wiring configuration in a logic circuit of a semiconductor product, whereby the signal lines can be connected in a greater variety of ways, and hence the layout area in the logic circuit can be reduced.

Figure 11:
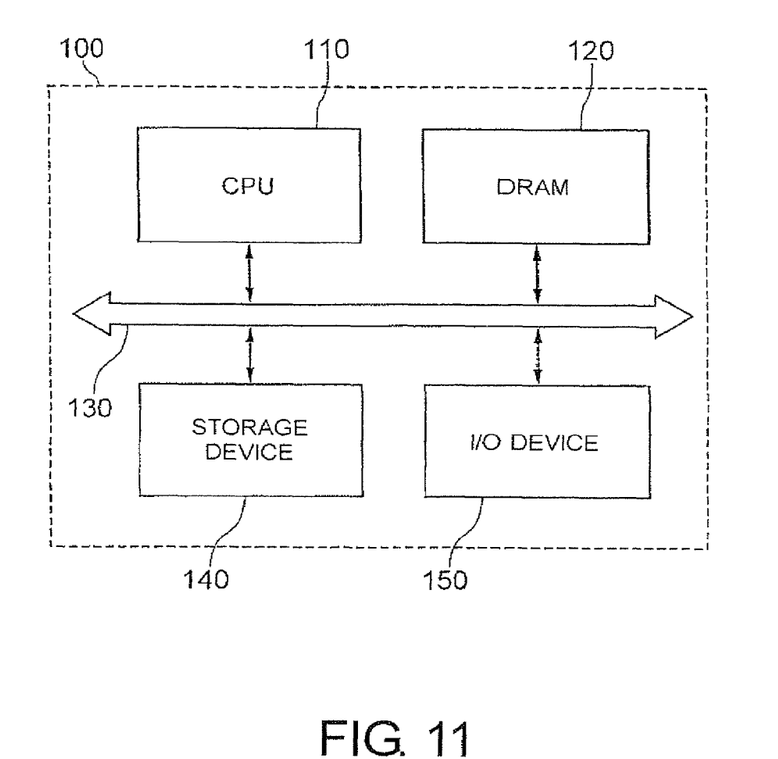
FIG. 11 is a block diagram showing a semiconductor device according to a fourth exemplary embodiment of this invention.

FIG. 11 is a block diagram showing a fourth exemplary embodiment of this invention. The fourth embodiment provides a data processing system including a semiconductor storage device (DRAM) according to the second embodiment. A data processing system 100 includes a CPU (Central Processing Unit) 110, a semiconductor storage device 120, a storage device 140 other than the semiconductor storage device, an input/output device 150. Although the CPU 110 is connected to the semiconductor storage device 120 through a system bus 130 in FIG. 11, they may be connected to each other through a local bus instead of the system bus 130. Although only one system bus 130 is shown for the sake of simplicity of illustration, it actually includes a plurality of buses, which are connected in series or in parallel by means of a connector or the like as required. As shown in FIG. 11, if necessary, the storage device 140 other than the semiconductor storage device of the second embodiment and the input/output device 150 may be connected to the system bus 130.

The input/output device 150 may be a display device such as a liquid crystal display. The storage device 140 other than the semiconductor storage device may be a hard disk or an MO drive. However, the fourth embodiment of this invention is not limited to these. The input/output device 150 may be either one of input and output devices. The semiconductor storage device 120 is for example a RAM (Random Access Memory) or a ROM (Read Only Memory), and is more specifically, a DRAM such as a SRAM (Static Random-Access-Memory), a SDRAM (Synchronous Dynamic Random-Access-Memory), a DDR-SDRAM (Double Data Rate Synchronous Dynamic Random-Access-Memory), a DDR2-SDRAM (Double Data Rate 2 Synchronous Dynamic Random-Access-Memory), or a DDR3-SDRAM (Double Data Rate 3 Synchronous Dynamic Random-Access-Memory), or a storage medium formed by a semiconductor element such as a flash memory. Although only one each of the components of the system is shown in FIG. 11 for the sake of simplification, the numbers of the components are not limited to this, but the numbers of all or any of the components may be a plurality.

In addition to a DRAM, the semiconductor device of this invention may be, for example, a semiconductor storage device having a memory function such as NAND-type flash memory, a semiconductor device having a logic function such as a microprocessor, and a semiconductor device for forming an arbitrary system having two or more such semiconductor devices.

In the exemplary embodiments of this invention, a slit pattern is used, in place of a hole pattern, during the self-aligning etching process for forming contact holes, whereby the resolution can be improved in miniaturized photolithography, and the problems relating to dimensional accuracy or misalignment of the slits in their extension direction can be avoided. The depth of the slits also can be determined, only taking into consideration the formation of contacts, and thus the aspect ratio in etching can be minimized. Further, it is made possible to ensure the SiN protecting film to be left with a sufficient thickness, by providing the dummy insulation films for functioning as a mask during CMP for isolation of the slits, separately from the insulation protecting films for covering the wiring lines. These features enable miniaturization of configuration of the semiconductor device.

Although the invention has been described with reference to specific and exemplary embodiments thereof, this invention is not limited to these embodiments and modifications thereof. It will be understood by those skilled in the art that various other changes and modifications may be made without departing from the scope and the spirit of the invention as defined in the appended claims.

What is claimed is:

1. A manufacturing method of a semiconductor device, comprising:

forming a wiring layer including a plurality of wiring lines, the plurality of wiring lines being arranged in a first direction, each of the plurality of wiring lines extending in a second direction perpendicular to the first direction;

forming a first interlayer insulation film to cover the wiring layer;

forming a plurality of dummy insulation films above the first interlayer insulation film, such that each of said plurality of dummy insulation films is aligned with a corresponding one of the plurality of wiring lines;

forming a second interlayer insulation film over top surfaces of the plurality of dummy insulation films to cover the plurality of dummy insulation films and the first interlayer insulation film;

forming a slit groove in the second interlayer insulation film while leaving a portion of the second interlayer insulation film over the top surfaces of the dummy insulation films so that the slit groove continuously extends over the plurality of dummy insulation films in the first direction to expose the plurality of dummy insulation films;

forming a plurality of via holes passing through the first and second interlayer insulation films from the slit groove by using the second interlayer insulation film and the plurality of dummy insulation films as a mask; and forming a plurality of via plugs within the via holes.

2. The method as claimed in claim 1, wherein a surface of each of the plurality of wiring lines is covered with an insulation protecting film.

3. The method as claimed in claim 2,
wherein the plurality of via holes are formed in a self-aligned manner with the plurality of wiring lines and the insulation protecting film.

4. The method as claimed in claim 1, further comprising:
forming a plurality of side portions each on a side wall of a corresponding one of the dummy insulation films by depositing and etching back an insulating layer,
wherein, the second interlayer insulation film is formed to cover the plurality of side portions, and
wherein the slit groove continuously exposes the plurality of side portions.

5. The method as claimed in claim 1,
wherein the plurality of dummy insulation films are formed in a same layout as that of the plurality of wiring lines.

6. The method as claimed in claim 1,
wherein each of the plurality of via plugs is isolated from each other.

7. The method as claimed in claim 1, further comprising:
forming a side wall layer on a side wall of each of the plurality of wiring lines before forming the first interlayer insulation film.

8. The method as claimed in claim 1, further comprising:
forming a third insulating film after forming the plurality of via plugs to cover the second interlayer insulation film, the third insulating film having openings to expose the plurality of via plugs; and
forming a capacitor node in the openings.

9. The method as claimed in claim 1,
wherein a CMP process is performed to remove the conductive layer such that a portion of the plurality of dummy insulation films remains, and
wherein the method further comprises:
forming a second wiring line on the via plug in a condition that the portion of the dummy insulation films remains.

10. A manufacturing method of a semiconductor device, comprising:

forming a wiring layer including a plurality of wiring lines, the plurality of wiring lines being arranged in a first direction, each of the plurality of wiring lines extending in a second direction perpendicular to the first direction;

forming a first insulation film to cover the wiring layer;

forming a plurality of dummy insulation films above the first insulation film, each of the plurality of dummy insulating films extending in the second direction;

forming a second insulation film over top surfaces of the plurality of dummy insulation films to cover the plurality of dummy insulation films and the first insulation film;

forming a slit groove in the second insulation film while leaving a portion of the second insulation film over the top surfaces of the dummy insulation films so that the slit groove continuously extends over the plurality of dummy insulation films in the first direction to expose the plurality of dummy insulation films;

forming a plurality of via holes passing through the first insulation film from the slit groove, by using the second insulation film and the plurality of dummy insulation films as a mask; and forming a plurality of via plugs within the via holes.

11. The method as claimed in claim 10, wherein the surface of each of the plurality of wiring lines is covered with an insulation protecting film.

12. The method as claimed in claim 11,
wherein the plurality of via holes are formed in a self-aligned manner with the plurality of wiring lines and the insulation protecting film.

13. The method as claimed in claim 10, further comprising:
forming a plurality of side portions each on a side wall of a corresponding one of the dummy insulation films by depositing and etching back an insulating layer,
wherein the second interlayer insulation film is formed to cover the plurality of side portions, and
wherein the slit groove continuously exposes the plurality of side portions.

14. The method as claimed in claim 10,
wherein the plurality of dummy insulation films are formed in a same layout as that of the plurality of wiring lines.

15. The method as claimed in claim 10,
wherein the via plugs are isolated from each other.

16. The method as claimed in claim 10, further comprising:
forming a side wall layer on a side wall of each of the plurality of wiring lines before forming the first interlayer insulation film.

17. The method as claimed in claim 10, further comprising:
forming a third insulating film after forming the plurality of via plugs to cover the second interlayer insulation film, the third insulating film having openings to expose the plurality of via plugs; and
forming a capacitor node in the openings.

18. The method as claimed in claim 10, wherein a CMP process is performed to remove the conductive layer such that a portion of the plurality of dummy insulation films remain, and
wherein the method further comprises:
forming a second wiring line on the via plug in a condition that the portion of the dummy insulation films remains.

19. The method as claimed in claim 10, further comprising:
forming a plurality of side portions each on a side wall of a corresponding one of the dummy insulation films.

20. The method as claimed in claim 19,
wherein the slit groove exposes the plurality of side portions, and wherein the plurality of via holes are formed by using the plurality of second portions as a mask.

* * * * *